US009335972B2

(12) United States Patent
Yang et al.

(10) Patent No.: US 9,335,972 B2
(45) Date of Patent: May 10, 2016

(54) TRUE RANDOM NUMBER GENERATOR

(71) Applicants: Kaiyuan Yang, Ann Arbor, MI (US); Dennis Michael Sylvester, Ann Arbor, MI (US); David Theodore Blaauw, Ann Arbor, MI (US); David Alan Fick, Ann Arbor, MI (US); Michael B. Henry, Ann Arbor, MI (US); Yoonmyung Lee, Ann Arbor, MI (US)

(72) Inventors: Kaiyuan Yang, Ann Arbor, MI (US); Dennis Michael Sylvester, Ann Arbor, MI (US); David Theodore Blaauw, Ann Arbor, MI (US); David Alan Fick, Ann Arbor, MI (US); Michael B. Henry, Ann Arbor, MI (US); Yoonmyung Lee, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 349 days.

(21) Appl. No.: 14/093,040

(22) Filed: Nov. 29, 2013

(65) Prior Publication Data
US 2015/0154006 A1    Jun. 4, 2015

(51) Int. Cl.
*G06F 7/58* (2006.01)
*H03K 3/84* (2006.01)
*H03K 3/03* (2006.01)

(52) U.S. Cl.
CPC *G06F 7/588* (2013.01); *H03K 3/84* (2013.01); *H03K 3/0315* (2013.01)

(58) Field of Classification Search
CPC ........................................... G06F 7/588
See application file for complete search history.

(56) References Cited

U.S. PATENT DOCUMENTS

| 8,410,857 B2 * | 4/2013 | Dichtl | G06F 7/588 331/57 |
| 2008/0091755 A1 * | 4/2008 | Mudge | H04L 9/0866 708/250 |

OTHER PUBLICATIONS

Q. Chen et al, "The Bistable Ring PUF: A New Architecture for Strong Physical Unclonable Functions" *2011 IEEE International Symposium on Hardware-Oriented Security and Trust (HOST)*, IEEE, 2011, pp. 134-141.
M. Bucci, et al., "A High Speed Oscillator Based True Random Number Generator for Cryptographic Applications on a Smart Card IC," *IEEE Trans. Computers*, Apr. 2003, 7 pgs.
C. Petrie, et al., "A Noise-Based IC Random Number Generator for Applications in Cryptography," *IEEE TCAS-I*, May 2000, 7 pgs.
R. Brederlow, et al., "A Low-Power True Random Number Generator using Random Telegraph Noise of Single Oxide Traps," *ISSCC*, 2006, 10 pgs.
C. Tokunaga, et al., "True Random Number Generator with a Metastability-Based Quality Control," *ISSCC*, 2007, 3 pgs.
S. Mathew, et al., "2.4Gbps, 7mW All-Digital PVT-variation Tolerant True Random Number Generator for 45nm CMOS High-Performance Microprocessors", *IEEE JSSC*, Nov. 2012, 15 pgs.
M. Matsumoto, et al., "1200 $\mu m^2$ Physical Random-Number Generators Based on SiN MOSFET for Secure Smart-Card Application," *ISSCC*, 2008, 3 pgs.

(Continued)

*Primary Examiner* — Andrew Caldwell
*Assistant Examiner* — James D Riddle
(74) *Attorney, Agent, or Firm* — Nixon & Vanderhye P.C.

(57) ABSTRACT

A true random number generator comprises a ring oscillator which is triggered to start oscillating in a first mode of oscillation at an oscillation start time. The first mode of oscillation will eventually collapse to a second mode of oscillation dependent on thermal noise. A collapse time from the oscillation start time to the time at which the oscillator collapses to the second mode is measured, and this can be used to determine a random number. The TRNG can be synthesized entirely using standard digital techniques and is able to provide high randomness, good throughput and energy efficiency.

20 Claims, 8 Drawing Sheets

(56) References Cited

OTHER PUBLICATIONS

N. Liu, et al., "A true random number generator using time-dependent dielectric breakdown," *Symp VLSI Circuits*, 2011, 2 pgs.

A. Markettos, et al., "The Frequency Injection Attack on Ring-Oscillator-Based True Random Number Generators," CHES, pp. 317-331, 2009, 16 pgs.

* cited by examiner

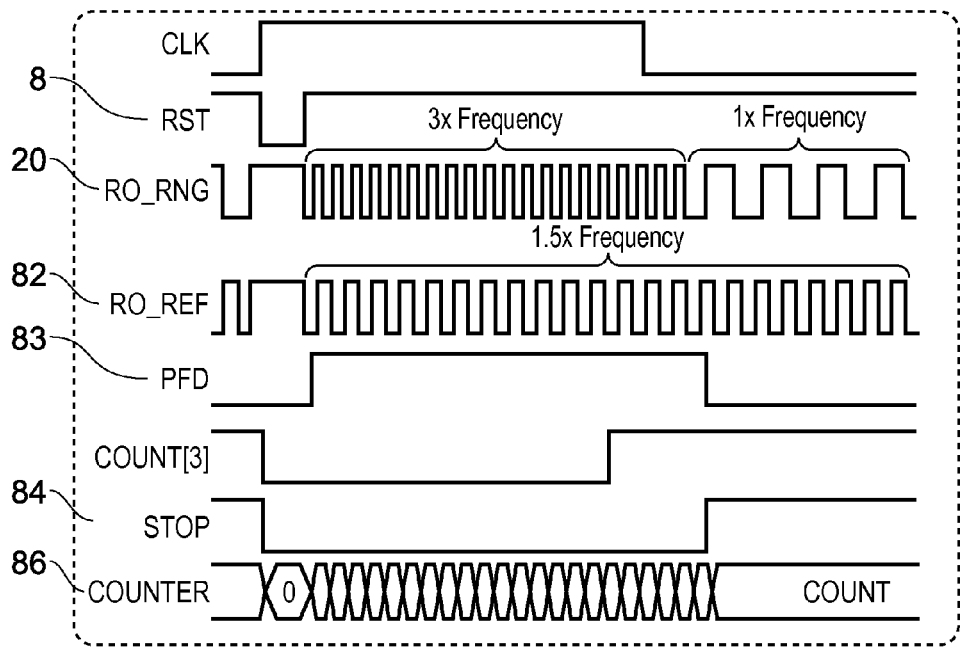

k - # stages in RO
n - # cycles $t_{falling} = \sum_{i=1}^{n \cdot k+k} (t_{stage} + \delta_{n,i}), \delta_{n,i} \sim N(0,\sigma^2)$ $-t_{rising} = \sum_{i=1}^{n \cdot k} (t_{stage} + \delta_{n,i}), \delta_{n,i} \sim N(0,\sigma^2)$ $t_{pulse} = \sum_{i=n \cdot k+1}^{n \cdot k+k} (t_{stage} + \delta_{n,i})$ $\sim N(k \cdot t_{stage} + k\sigma^2)$ Variance fixed with # cycles Conventional Ring Oscillator $t_{falling} = \sum_{j=1}^{n \cdot k+k/3} (t_{stage} + \delta_{n,j}), \delta_{n,j} \sim N(0,\sigma^2)$ $-t_{rising} = \sum_{i=1}^{n \cdot k} (t_{stage} + \delta_{n,i}), \delta_{n,i} \sim N(0,\sigma^2)$ $t_{pulse} = \sum_{i=n \cdot k}^{n \cdot k+k/3} t_{stage} + \sum_{j=1}^{n \cdot k+k/3} \delta_{n,j} - \sum_{i=1}^{n \cdot k} \delta_{n,i}$ $\sim N(\frac{k}{3} \cdot t_{stage}, (2n \cdot k + \frac{k}{3})\sigma^2)$ variance increasing linearly with # cycles 3-edge Ring Oscillator

| Test Name | 65nm, 21 stage RO, 0.9V, 2.80Mb/s | | 28nm, 21 stage RO, 0.9V, 23.16Mb/s | |
|---|---|---|---|---|
| | P-value $\chi^2$ | Pass Rate | P-value $\chi^2$ | Pass Rate |
| Frequency | 0.785562 | 296/300 | 0.872947 | 297/300 |
| Block Frequency | 0.082177 | 297/300 | 0.746572 | 297/300 |
| Cumulativ Sum | 0.462245 | 294/300 | 0.955835 | 296/300 |
| Cumulativ Sum | 0.942895 | 295/300 | 0.329332 | 294/300 |
| Runs | 0.220931 | 296/300 | 0.574903 | 297/300 |
| Longest Runs | 0.329332 | 296/300 | 0.81047 | 298/300 |
| Matrix Rank | 0.046668 | 294/300 | 0.000682 | 296/300 |
| FFT | 0.03013 | 295/300 | 0.224821 | 295/300 |
| Non Overlapping Template | PASS* | PASS* | PASS* | PASS* |
| Overlapping Template | 0.878107 | 297/300 | 0.329332 | 296/300 |
| Linear Complexity | 0.487885 | 297/300 | 0.304126 | 295/300 |
| Universal | 0.935716 | 98/100 | 0.719747 | 99/100 |
| Random Excursions | PASS* | PASS* | PASS* | PASS* |
| Random Excursions Variant | PASS* | PASS* | PASS* | PASS* |
| Approximate Entropy | 0.514124 | 100/100 | 0.275709 | 100/100 |
| Serial | 0.304126 | 99/100 | 0.897763 | 99/100 |
| Serial | 0.867692 | 99/100 | 0.595549 | 100/100 |

\* Non overlapping, random excursions and random excursions variant tests have 148, 8 and 18 sub tests, respectively. "PASS" means all sub tests pass minimum requirement.
\*\* Minimum p-value $\chi^2$ is 0.0001.
\*\*\* Minimum pass rate is 291/300 for first 10 tests and 96/100 for the other 5 tests.

FIG. 10

| | This work (25°C, 0.9V core supply) | | JSSC' 12 [5] | VLSI' 11 [7] | ISSCC' 08 [6] | ISSCC' 07 [4] | ISSCC' 06 [3] | Trans. Computers '03 [1] |
|---|---|---|---|---|---|---|---|---|
| Technology | 28nm | 65nm | 45nm | 65nm | 0.25µm | 0.13µm | 0.12µm | 0.18µm |
| Entropy Source | Jitter in 3-edge RO | | Metastability | Oxide breakdown | SiN MOS-FET Noise | Metastability | Metastability | Oscillator jitter |
| Bit Rate (Mb/s) | 23.16 | 2.8 | 2400 | 0.011 | 2 | 0.2 | 0.2 | 10 |
| NIST Pass | All | All | All | All | not reportedb | 5 | not reported | not reportedb |
| TRNG Core Area (µm²) | 375 | 960 (1080a) | 4004 | 1200 | 1200 | 36300 | 9000 | 16000 |
| Power (mW) | 0.54 | 0.159 | 7 | 2 | 1.9 | 1 | 0.05 | 2.3 |
| Efficiency (nJ/bit) | 0.023 | 0.057 | 0.0029 | 181.81 | 0.95 | 5 | 0.25 | 0.23 |
| Post Processing | No | No | No | No | Yes | No | Yes | no |
| Resistance to Attack | Yes | Yes | Not reported | Not reported | Not reported | Not reported | Not reported | Noc | a Including 1/8th of filter area (MIM cap and poly resistor); 1 filter is shared by 8 TRNGs and MIM cap is placed above TRNGs.
b NIST FIPS 140-2 test result is provided, which is older, less rigorous than NIST Pub 800-22 with 4 tests and only 20,000 bits required.
c Commercial TRNG based on similar RO approach is successfully attacked in [8]

FIG. 12

TRUE RANDOM NUMBER GENERATOR

TECHNICAL FIELD

The present technique relates to the field of true random number generators.

TECHNICAL BACKGROUND

A true random number generator (TRNG) measures random numbers based on a physical phenomenon that is expected to be random, such as atmospheric noise, thermal noise, or radioactive decay for example. Since the physical phenomenon used as the entropy source for the TRNG is unpredictable, the generated random numbers are truly random. This contrasts with pseudo random number generators (PRNGs), which use mathematical formulae or precalculated tables of random numbers to produce sequences of numbers that appear random, but are actually predictable and deterministic given the initial seed condition used to generate the pseudo random numbers. For many applications, PRNGs are sufficient and these may typically be implemented more cheaply than a TRNG. However, for other applications the true randomness generated by a TRNG is essential and a PRNG may not be sufficient.

Previous work has demonstrated TRNGs based on a resistor-amplifier-ADC chain, oscillator jitter, metastability and other device noise. However, analog designs suffer from variation and noise, making them difficult to integrate with digital circuits. Recent metastability-based methods provide excellent performance but often require careful calibration to remove bias. SiN MOSFETs exploit larger thermal noise but require post-processing to achieve sufficient randomness. An oxide breakdown-based TRNG shows high entropy but suffers from low performance and high energy/bit. Ring oscillator (RO) based TRNGs offer the advantage of design simplicity, but previous methods using a slow jittery clock to sample a fast clock provide low randomness and are vulnerable to power supply attacks. In addition, the majority of previous methods cannot pass all NIST (National Institute of Standards and Technology) randomness tests.

The present technique seeks to provide a TRNG that can simultaneously achieve ease of design, high randomness, good throughput, energy efficiency and resistance to attack.

SUMMARY OF THE PRESENT TECHNIQUE

Viewed from one aspect, the present technique provides a true random number generator (TRNG) comprising:
a ring oscillator;
a control circuit configured to trigger the ring oscillator to start oscillating in a first mode of oscillation at an oscillation start time; and
a time measuring circuit configured to measure a collapse time value indicative of a length of time from the oscillation start time to an oscillation collapse time at which the ring oscillator switches from the first mode of oscillation to a second mode of oscillation.

The present technique provides a ring oscillator which can oscillate in a first mode of oscillation and a second mode of oscillation. The first mode of oscillation may be unstable and so after a period of time the ring oscillator may collapse to the second mode of oscillation. The length of time taken to collapse from the first to the second mode of oscillation may depend on thermal noise, and so by measuring a collapse time value indicating the length of time from the start of oscillation in the first mode of oscillation to the collapse to the second mode of oscillation, the collapse time value can be used to derive a true random number. This contrasts with conventional ring oscillator based TRNGs which use jitter within a single mode of oscillation as the source of randomness, rather than the collapse from one mode of oscillation to another. Unlike previous approaches, a TRNG according to present technique can be synthesized entirely using standard digital synthesis techniques (e.g. using a standard cell library and conventional placing and routing tools) while still providing a high degree of randomness, making the TRNG cheaper and simpler to construct. Also, the throughput (number of random bits generated per second), energy efficiency (energy consumption per random bit generated) and circuit area are improved relative to previous techniques.

In one example, in the first mode of oscillation the ring oscillator may oscillate at a higher frequency than in the second mode of oscillation. The collapse of the second mode of oscillation can then be detected from a reduction in frequency of an output of the ring oscillator.

For example, in the first mode of oscillation the ring oscillator may propagate multiple edges around the ring oscillator with a phase difference between each edge. For example, the ring oscillator may have a number of stages with multiple input nodes located at different stages of the ring oscillator. A control circuit may supply a start signal to the multiple input nodes, and in response to the start signal, each input node may inject a respective edge into the ring oscillator. Each edge will then propagate around the ring in the same way as a single-edge ring oscillator. Each edge has the same period as the single-edge oscillator, but the edges are phase shifted with respect to each other and the overall frequency at a given output point is higher. Over time, each edge will independently accumulate jitter from thermal noise, causing an increasing variation of the pulse width between two neighboring edges with each complete cycle. Eventually, two neighboring edges will get so close together that they collapse and cancel each other out, leaving one or more other edges remaining. At this point, the frequency of the ring oscillator drops because there are now fewer edges in the second mode of oscillation than in the first mode of oscillation. The time taken from the start of oscillation in the first mode to the collapse to the second mode reflects the accumulation of jitter at each edge and can therefore be used as the entropy source for random number generation. Also, the collapse time will be independent of any process variation in the ring oscillator because each edge passes through the same ring oscillator stages, evening out any mismatch in the switching time for each stage.

In general, the second mode of oscillation may have fewer edges propagating around the ring oscillator than the first mode. However, it may be simplest to detect the collapse when the second mode of oscillation propagates only a single edge.

The first mode of oscillation may propagate any number of edges. However, it may be preferable to provide a mode of oscillation where an odd number of edges greater than one propagate around the ring oscillator. With an even number of edges, the first mode of oscillation is more susceptible to process variation because a given stage of the ring oscillator will act only on rising edges or falling edges of the pulses, which may reduce the randomness of the collapse time. By using an odd number of edges, this process variation can be eliminated because each stage of the ring oscillator will act on both rising and falling edges. Any odd number of edges may be used in the first mode of oscillation, although it has been found that a three edge mode of oscillation is sufficient. In this example, the ring oscillator may be provided with three input nodes for injecting the respective edges in response to the start signal, and then over time two of these edges may drift closer together and cancel each other out, leaving the third edge as the single edge oscillating in the second mode of oscillation.

At the start of oscillation in the first mode, it is possible to inject edges with different phase differences between each successive pair of neighboring edges. Hence, the input nodes associated with each edge need not be evenly distributed around the ring. However, it may be preferable to provide the edges with an equal phase difference at the start of the first mode of oscillation, because this can increase the amount of randomness. When the initial edges are evenly distributed in phase, then which pair of edges will collapse together first will be unpredictable and dependent on thermal noise, and so the overall randomness will be dependent on thermal noise experienced by each of the edges. In contrast, if some of the edges are closer together in phase than others then the edges which start off closer together are more likely to be the ones that collapse together and so the randomness will be affected by the jitter in these edges more than the jitter in other edges. Therefore, it may be preferable to inject the edges at evenly distributed points around the ring.

The start signal may in some embodiments comprise a pulse with a first edge which resets the ring oscillator and a second edge which triggers the ring oscillator to start oscillating in the first mode of oscillation.

The time measuring circuit for measuring the collapse time value may be implemented in a number of ways. For example, the time measuring circuit may have a cycle counter which maintains a cycle count value indicating the number of cycles which have elapsed since the oscillation start time. A collapse detector may output a collapse signal in response to detecting the ring oscillator switching from the first mode to the second mode of oscillation. A capture circuit may respond to the collapse signal from the collapse detector by capturing a current value of the cycle count value from the cycle counter. Hence, the captured value will be indicative of the number of cycles taken to collapse to the second mode of oscillation, and this can be output and used to derive a true random number.

While in general the cycle counter may use any reference clock to count the number of cycles, it can be advantageous for the cycle counter to count oscillation cycles of the ring oscillator itself. Firstly, this reduces the need to provide a further oscillator for providing the count reference clock. Also, as the frequency of the ring oscillator may be higher in the first mode than in the second mode, then when the ring oscillator collapses to the second mode, the period between successive cycles will be increased and so there is more time available for the capture circuit (e.g. a latch) to capture the current value of the cycle count before it is incremented again in response to another cycle of the ring oscillator.

In one example, the collapse detector may comprise a phase frequency detector (PFD) which generates the collapse signal based on a phase comparison of an output of the ring oscillator and an output of a reference ring oscillator which oscillates at a predetermined frequency. Where the first mode of oscillation of the ring oscillator has a first frequency which is greater than a second frequency of the second mode of oscillation, the reference ring oscillator may be set so that the predetermined frequency is between the first and second frequencies. Hence, when the ring oscillator is in the first mode of oscillation then it will be oscillating faster than the reference ring oscillator and when the ring oscillator is in the second mode of oscillation it will be oscillating slower than the reference ring oscillator. The phase frequency detector can output a signal which indicates the relative frequency of the two oscillators and this can be used to determine when the ring oscillator has collapsed to the second mode of oscillation.

It can be useful to provide a glitch removal circuit to filter out glitches in the collapse signal generated by the collapse detector. For example, when a phase frequency detector is used then there may be the odd glitch when the collapse signal changes value for a short period of time before returning to its previous value even though there was not a change in the mode of oscillation of the ring oscillator. The glitch removal circuit can filter out these short glitches so that the collapse is only detected when there is a more long term change in the state of the collapse signal. For example, the glitch removal circuit may comprise an AND gate which receives as inputs the collapse signal and a delayed version of the collapse signal. This ensures that if the collapse signal changes state for a shorter period of time than the delay through the delaying buffer/inverter, then this glitch will not cause a collapse detection.

In addition to or instead of the glitch removal circuit, a shift register may be provided in the time measuring circuit for increasing the confidence in collapse detection. The shift register may have a number of shift stages, with each shift stage receiving the output of the preceding stage in each clock cycle. The collapse signal may be input at a first stage of the shift register and then the output of a final stage of the shift register may be sent to the capture device. This effectively delays the collapse signal so that the capture device detects the change in state of the collapse signal a number of cycles later than it was actually generated. If there is a change in state of the collapse detector shortly after an earlier transition then the shift register can be reset to prevent the previous transition affecting the capture device. This ensures that the capture device will only capture the current value of the cycle count value if the collapse signal changes and remains at its new value for a number of cycles equivalent to the number of shift stages of the shift register.

The TRNG may in some embodiments comprise a random number determining unit which determines a random number value based on the collapsed time value measured by the measuring circuit. However, this is not essential as in other embodiments the collapse time value may be output to an external device which is not part of the TRNG itself, and the external device may then determine the random number value.

It is possible to map the collapse time value directly to a random number value. However, as the collapse time value is dependent on thermal noise which will tend to exhibit a normal distribution, the collapse time value will take some numeric values more frequently than others. To produce a random number with a uniform probability distribution, the random number value may be determined based on a subset of bits of the collapse time value measured by the time measuring circuit. For example, the collapse time value may be truncated to generate a truncated value corresponding to a number of least significant bits of the collapse time value, and then the random number value may be determined based on the truncated value. The probability distribution with which the least significant bits of the collapse time value take different numeric values tends to be more uniform than the probability distribution for the collapse time value as a whole, and so truncating the collapse time value can improve the randomness of TRNG.

In some examples, it may also be desirable to exclude the least significant bit of the truncated value when determining the random number value. This can be useful to eliminate sensitivity of the random number to mismatch in the capture device which samples the cycle counter.

All hardware TRNGs should cope with interference from a potentially noisy environment as well as dedicated attacks attempting to reduce the randomness of the generated random numbers. It is known that ring oscillators may be sensitivity to frequency injection, if the power supply to the ring oscillator is noisy or an attacker deliberately introduces some high frequency noise on the power supply rail. It has been found that with the TRNG of the present technique, the components of an integrated circuit comprising the TRNG, which may have an inherent resistance and capacitance, may themselves provide sufficient noise filtering to protect against environmental noise and dedicated attacks. However, to improve protection against noise and reduce susceptibility to attacks, a low pass filter may be coupled between the ring oscillator and its power supply rail. The low pass filter may be provided with a cutoff frequency which is lower than the expected frequency at which noise is expected to affect the randomness of the generated numbers. In this way, a robust TRNG can be produced which is difficult to attack and which more reliably generates truly random numbers.

Viewed from another aspect, the present technique provides a true random number generator comprising:

ring oscillator means for oscillating in one of a first mode of oscillation and a second mode of oscillation;

control means for triggering the ring oscillator to start oscillating in the first mode of oscillation at an oscillation start time; and time measuring means for measuring a collapse time value indicative of a length of time from the oscillation start time to an oscillation collapse time at which the ring oscillator means switches from the first mode of oscillation to the second mode of oscillation.

Viewed from a further aspect, the present technique provides a method of generating a true random number, comprising:

at an oscillation start time, triggering a ring oscillator to start oscillating in a first mode of oscillation;

measuring a collapse time value indicative of a length of time from the oscillation start time to an oscillation collapse time at which the ring oscillator switches from the first mode of oscillation to a second mode of oscillation; and determining the true random number based on the collapse time value.

Further aspects, features and advantages of the present technique will be apparent from the following detailed description of the examples which is to be read in conjunction with the accompanying drawings.

BRIEF DESCRIPTION OF THE DRAWINGS

FIG. 6 shows mathematical analysis indicating that the ring oscillator of the present technique is expected to be effected by thermal noise more strongly than the conventional ring oscillator;

FIG. 8 is a timing diagram illustrating operation of the TRNG of FIG. 7;

FIG. 10 is a table indicating randomness test results for two example implementations of the TRNG;

FIG. 12 is a table comparing the TRNG of the present technique with previous techniques;

DESCRIPTION OF EXAMPLE EMBODIMENTS

Figure 1:
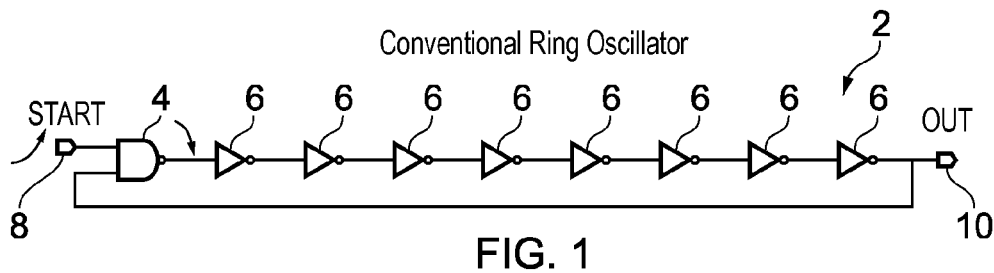
FIG. 1 illustrates a conventional ring oscillator.

FIG. 1 illustrates a conventional ring oscillator 2 having an odd number of inverter stages 4, 6. One of the inverter stages is an input inverter stage 4 in the form of a NAND gate which receives an output of an earlier inverter stage 6 and a start signal 8. After a reset of the oscillator 2, both inputs of the NAND gate 4 are at logical 0 and so the output of the NAND gate is at logical 1. When the start signal 8 rises to logical 1 then the NAND gate 4 falls down and this injects an edge into the ring oscillator which then propagates around the ring oscillator. As each inverter stage 6 has an associated delay then the edge takes some time to propagate around the ring. As there is an odd number of inverter stages, the signal at an output node 10 appears as a series of pulses having a given oscillator frequency, as shown in the top part of FIG. 3.

Figure 2:
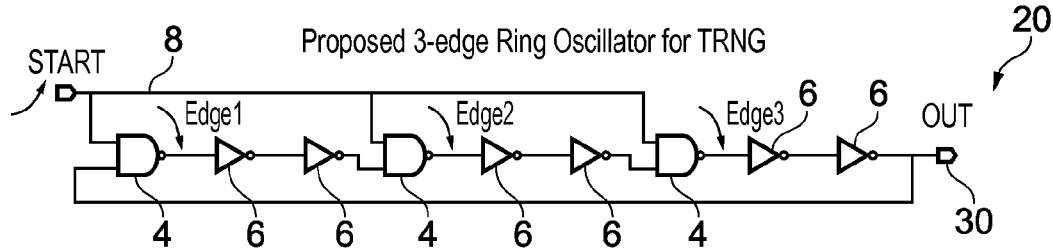
FIG. 2 illustrates a ring oscillator according to the present technique which can be triggered to oscillate in a first mode of oscillation before collapsing to a second mode of oscillation.
Figure 3:
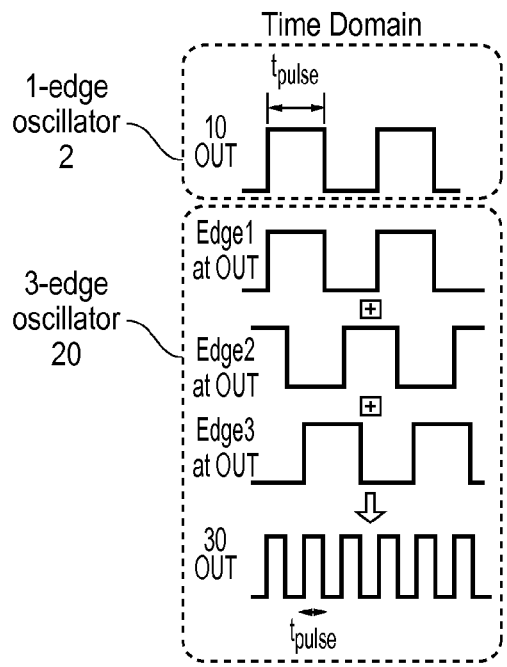
FIG. 3 is a timing diagram comparing oscillation of the ring oscillator of FIG. 1 with the ring oscillator of FIG. 2 when in the first mode of oscillation.

FIG. 2 illustrates a ring oscillator 20 according to the present technique. Unlike the conventional ring oscillator, in the ring oscillator 20 of FIG. 2 the start signal is input at three different input inverter stages (input nodes) 4, each comprising a NAND gate. Each input inverter stage 4 is positioned at a different point around the ring, and so in response to the rising edge of the start signal 8, this will trigger a first mode of oscillation in which the ring oscillator 20 propagates three edges around the ring with each edge being separated from the other edges by a given phase difference. The lower part of FIG. 3 shows a timing diagram illustrating the respective edges when detected at output node 30. Each edge has the same pulse width as in the conventional ring oscillator 2, but there is a phase shift between the respective edges. The second edge is inverted with respect to the first and third edges when it is detected at output node 30 because there is an odd number of inverter stages between the output node 30 and the second input node for inputting Edge 2, while there is an even number of inverter stages between the output node 30 and the first/third input nodes for inputting Edge 1 and Edge 3. The lower plot of FIG. 3 shows that the overall signal detected at the output node 30 has three times the frequency of the conventional ring oscillator signal.

Figure 4:
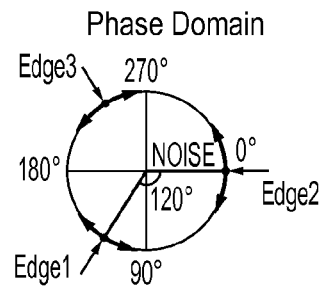
FIG. 4 is a phase diagram showing phase differences between the respective edges of the ring oscillator.

FIG. 4 is a phase diagram showing the phase difference between the respective edges in the first mode of oscillation of the oscillator 20. As the input inverter stages 4 are each separated from the neighboring inverter stage 4 by the same number of non-input inverter stages 6, then the phase difference between each pair of entries is the same (120 degrees in this example). However, in other embodiments it would be possible to provide unequal phase differences between respective pairs of edges. Also it is possible to provide a ring oscillator with more than three edges by including a different number of input inverter stages 4 which receive the start signal 8.

Figure 5:
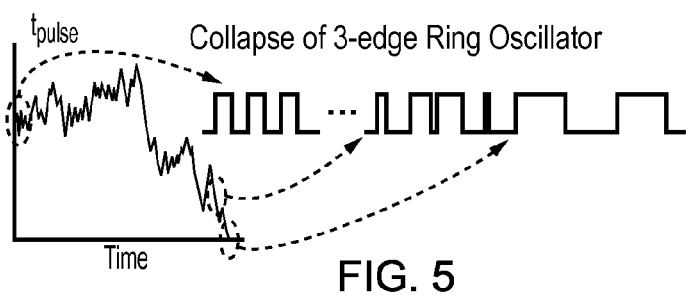
FIG. 5 illustrates collapse of the ring oscillator to a second mode of oscillation.

As shown in FIG. 4, in the first mode of oscillation each of the edges will independently accumulate jitter from thermal noise, causing an increasing variation of the pulse width between two neighboring edges with each completed cycle. This is shown in FIG. 5 where the pulse width initially is relatively even but gradually varies depending on the thermal noise. Over time, two neighboring edges eventually become so close together that they collapse and cancel each other out, leaving only one edge remaining and forcing the ring oscillator to a second mode of oscillation (corresponding to the conventional mode of oscillation of the oscillator in FIG. 1). The time taken from the start of oscillating in the first oscillation mode (3× frequency mode) to the collapse to the second oscillation mode (1× frequency mode) reflects the accumulation of jitter and is used as an entropy source for random number generation. Process variation is inherently cancelled since all three edges pass through the same ring oscillation stages 4, 6, cancelling any mismatch between stages due to process variation.

FIG. 6 shows an analysis of the expected jitter. While in a conventional ring oscillator, the variance in pulse width is independent of the number of cycles n for which the ring oscillator has been oscillating, for the 3-edge ring oscillator of FIGS. 2 to 5, the variance increases linearly with the number of cycles N, meaning that there is a much greater entropy. This means that the randomness of the pulse width is much greater than in a conventional oscillator, leading to a high degree of randomness in the measured time to collapse to the second mode of oscillation.

Figure 7:
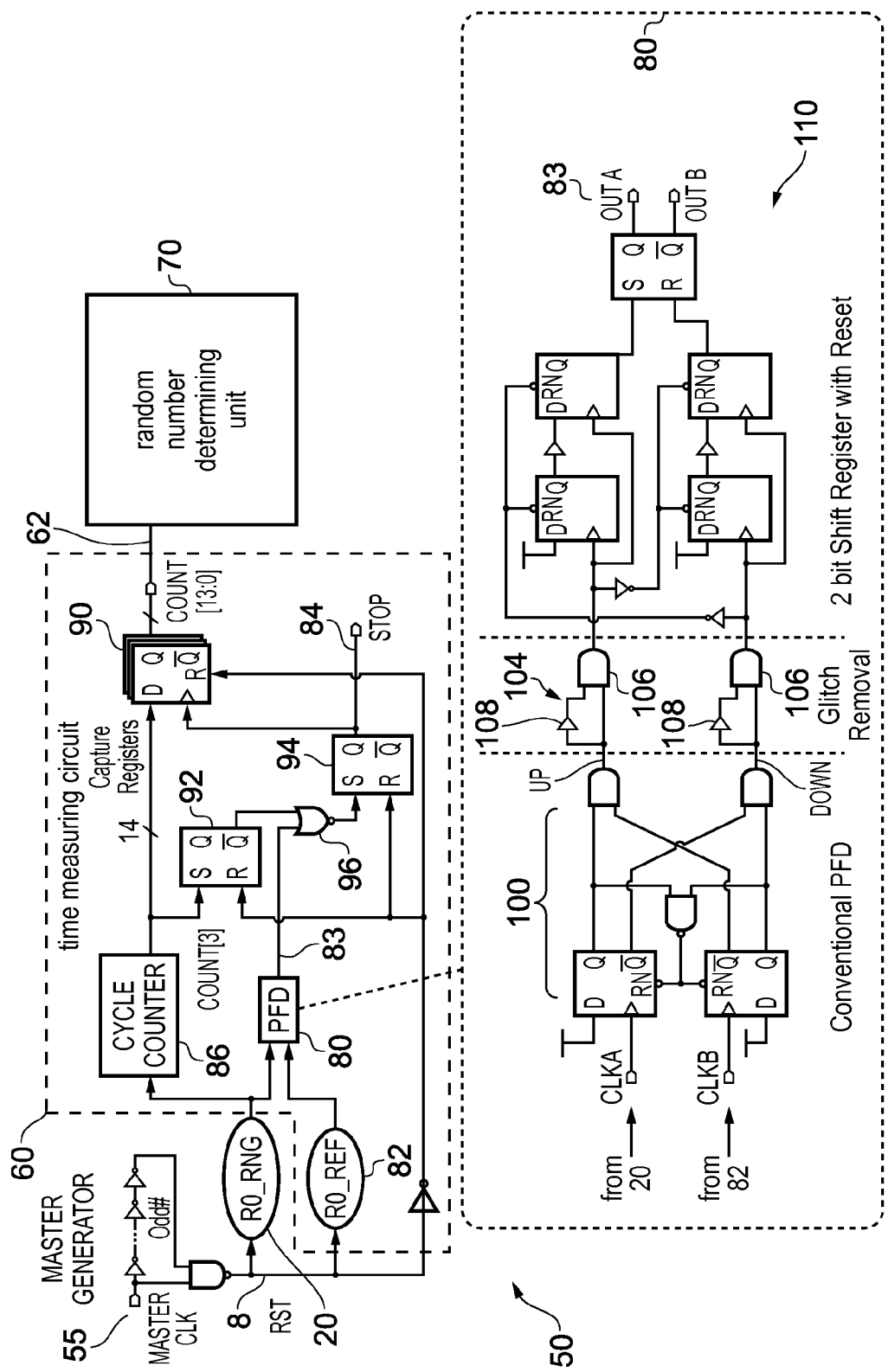
FIG. 7 illustrates a TRNG comprising the ring oscillator and a time measuring circuit for measuring the time to collapse to the second mode of oscillation.

FIG. 7 schematically illustrates an example of a true random number generator (TRNG) 50 including the ring oscillator 20 of FIG. 2. The TRNG 50 comprises a control circuit 55 comprising a master ring oscillator which generates a master clock signal. The control circuit 55 generates the start signal for the ring oscillator 20. The start signal is generated with a pulse comprising a falling edge followed by a rising edge. The falling edge resets the ring oscillator 20, while the rising edge triggers the ring oscillator 20 to start oscillating in the first mode of oscillation at an oscillation start time. A time measuring circuit 60 is provided for measuring the time from the oscillation start time to an oscillation collapse time at which the ring oscillation collapses to the second mode of oscillation. A collapse time value 62 is output by the time measuring circuit 60 to a random number determining unit 70 which determines a random number based on being measured collapse time value 62.

In this example, the time measuring circuit comprises a phase frequency detector (PFD) 80 which compares the phase of the output of the ring oscillator 20 and the output of a reference ring oscillator 82 which oscillates at a predetermined frequency which lies between the frequency of oscillation in the first mode of oscillation of the ring oscillator and the frequency in the second mode of oscillation. For example, the frequency of the reference ring oscillator 82 may be 1.5 times the frequency of the ring oscillator 20 in the second mode of oscillation (half the frequency of the ring oscillator 20 in the first mode of oscillation). This can be achieved by providing the reference ring oscillator 82 with two thirds the number of stages 4, 6 as the ring oscillator 20. Any conventional phase frequency detector design can be used for the PFD 80. An example PFD design is shown in FIG. 7. The PFD 80 outputs a collapse signal 83 which indicates whether the frequency of the ring oscillator 20 is greater or less than the frequency of the reference ring oscillator 82. Meanwhile, a cycle counter 86 counts cycles of the output of the ring oscillator 20 and outputs a count value based on the number of lapsed cycles. When the collapse signal 83 generated by the PFD 80 switches states to indicate that the ring oscillator 20 has switched from the first mode to the second mode of oscillation, then a capture register 90 is triggered to capture the current value of the count value generated by the cycle counter 86. The captured count value can then be read as the collapse time value 62 by the random number determining unit 70. The ring oscillator 20, reference ring oscillator 82 and capture registers 90 are all reset in response to the falling edge of the start signal 8 generated by the control signal 55.

The collapse signal 83 output by the PFD 80 could be output directly to the capture register 90 to trigger capturing the count value from the cycle counter 86. However, it is unlikely that the ring oscillator will collapse to the second mode after only a very few number of cycles. To prevent glitches in the collapse signal 83 triggering the capture of the count value during the first few cycles, which would be likely to be incorrect and may skew the random number distribution, an intermediate bit of the counter (bit [3] in this example) is used to prevent false triggers of the collapse in the first few cycles. Latches 92, 94 and NOR gate 96 prevent the capture registers 90 from capturing the cycle count until bit 3 of the count value has switched to logical 1. The capture registers 90 are triggered by the gated collapse signal 84 output from the latch 94 instead of the collapse signal 83 output by the PFD. This ensures that the collapse event cannot be detected in the first eight cycles of operation. If a different number of cycles is required for the initial period, then a different bit of the cycle count value can be used to gate the collapse detection.

The lower part of FIG. 7 illustrates an example circuit arrangement for the PFD 80. As the frequency change between the first and second modes of oscillation of the ring oscillator 20 is large (a threefold difference in frequency), a conventional digital implementation of the PFD 80 can be used, which enables a fully synthesizable design. The PFD 80 includes a standard PFD design 100 which receives the output CLKA from the ring oscillator 20 and the output CLKB from the reference ring oscillator 82. The PFD 100 generates signals UP, DOWN such that if the ring oscillator 20 has a greater frequency than the reference ring oscillator 82 then the UP signal will be high for the majority of the time and the DOWN signal will be low for the majority of the time, aside from the odd glitch when there is a pulse of the reference ring oscillator 82. On the other hand, if the ring oscillator 20 has a lower frequency than the reference ring oscillator 82, then the UP signal will be low for the majority of the time and the DOWN signal will be high for the majority of the time, aside for the odd glitch when a pulse of the random number generating ring oscillator 20 is received. A glitch removal stage 104 is provided to remove these glitches. The glitch removal stage 104 comprises glitch removal circuits on both the UP and DOWN signal paths. Each glitch removal circuit comprises an AND gate 106 and a buffer (which could be an inverter in other embodiments) 108. The buffer/inverter 108 delays the received signal and the delayed and non-delayed versions of the signal are input to the AND gate 106. The output of the AND gate 106 will be high only if both of the delayed and non-delayed signals are high, so when the UP or DOWN signals transition high then the output of the AND 106 will switch high only if the high value of the up signal persists for longer than the gate delay of the buffer/inverter 108. This eliminates short glitches where the signal temporarily switches value. In other embodiments, the glitch removal circuit could be provided within other parts of the time measuring circuit 60 rather than as part of the PFD 80 as shown in FIG. 7.

Also, the PFD 80 may have a shift register stage 110 which delays the collapse signal for a number of cycles. In this example a 2-bit shift register is provided and so there is a two cycle delay in the output of the collapse signal 83 (although a greater number of stages could be provided if desired). Each of the UP and DOWN signals is passed through a two-stage shift register, the UP shift register is reset if there is a rising edge transition in the DOWN signal, and the DOWN shift register is reset if there is a rising edge transition in the UP signal. The shift register stage ensures that a change in value of the UP/DOWN signals must persist for at least two consecutive cycles in order to be registered as a collapse event. Hence, the collapse event is flagged only after two consecutive cycles of the ring oscillator 20 are detected at the lower frequency.

The collapse signal 83 output by the PFD 80 may be based on either the UP output OUT_A or the DOWN output OUT_B of the shift register stage 110. In the example shown in FIG. 7, the collapse signal 83 is based on the UP output OUT_A, but a complementary time measuring circuit 60 could be constructed using the DOWN output OUT_B as the collapse signal 83. In other embodiments the shift register stage 110 may be provided in a different location within the time measuring circuit 60 or may be omitted altogether.

FIG. 8 shows a timing diagram illustrating the operation of the TRNG of FIG. 7. The master clock frequency in the control circuit 55 is set slow enough that the vast majority of collapse events complete within the active phase duration. In the tested design over 90% of collapse events completed on time. In general, with a 3-edge oscillator if the clock pulse of the master clock generated by the control circuit 55 is at least longer than the delay of a third of the total number of inverters in the ring shown in FIG. 2, then all nodes should be reset and restarted in time. In response to a rising edge of the master clock signal, a falling pulse of the start signal 8 is generated by the control circuit 55. The falling edge of the pulse resets the ring oscillator 20, the reference ring oscillator 82 and the various latches/registers 92, 94, 90 within the time measuring circuit 60. The rising edge of the pulse triggers the ring oscillator 20 to start oscillating in the first oscillation mode with 3 times the frequency of the second mode, and the reference ring oscillator 82 to oscillate at its predetermined frequency of 1.5 times the frequency of the second mode of the ring oscillator 20. The cycle counter 86 counts cycles of the ring oscillator 20. While in the first mode of oscillation, the frequency of the ring oscillator 20 is higher than the frequency of the reference ring oscillator 82 and so the output 83 of the PFD 80 is high. Eventually the bit (3) of the count signal from the cycle counter 86 transitions high and from this point on a change in the PFD output 83 will trigger a change in the gated collapse signal 84 (stop signal). When the ring oscillator 20 switches to the second mode of oscillation, then the PFD collapse signal 83 transitions low, causing the gated collapse signal 84 to transition high. This triggers the count register 90 to capture the current count value from a cycle counter 86. This value can then be read or output and used by the random number determining unit 70 to determine a random number.

In some embodiments, the random number determining unit 70 may not be provided in the TRNG 50 and instead the count value 62 may be output to an external device which then determines a random number.

Figure 9:
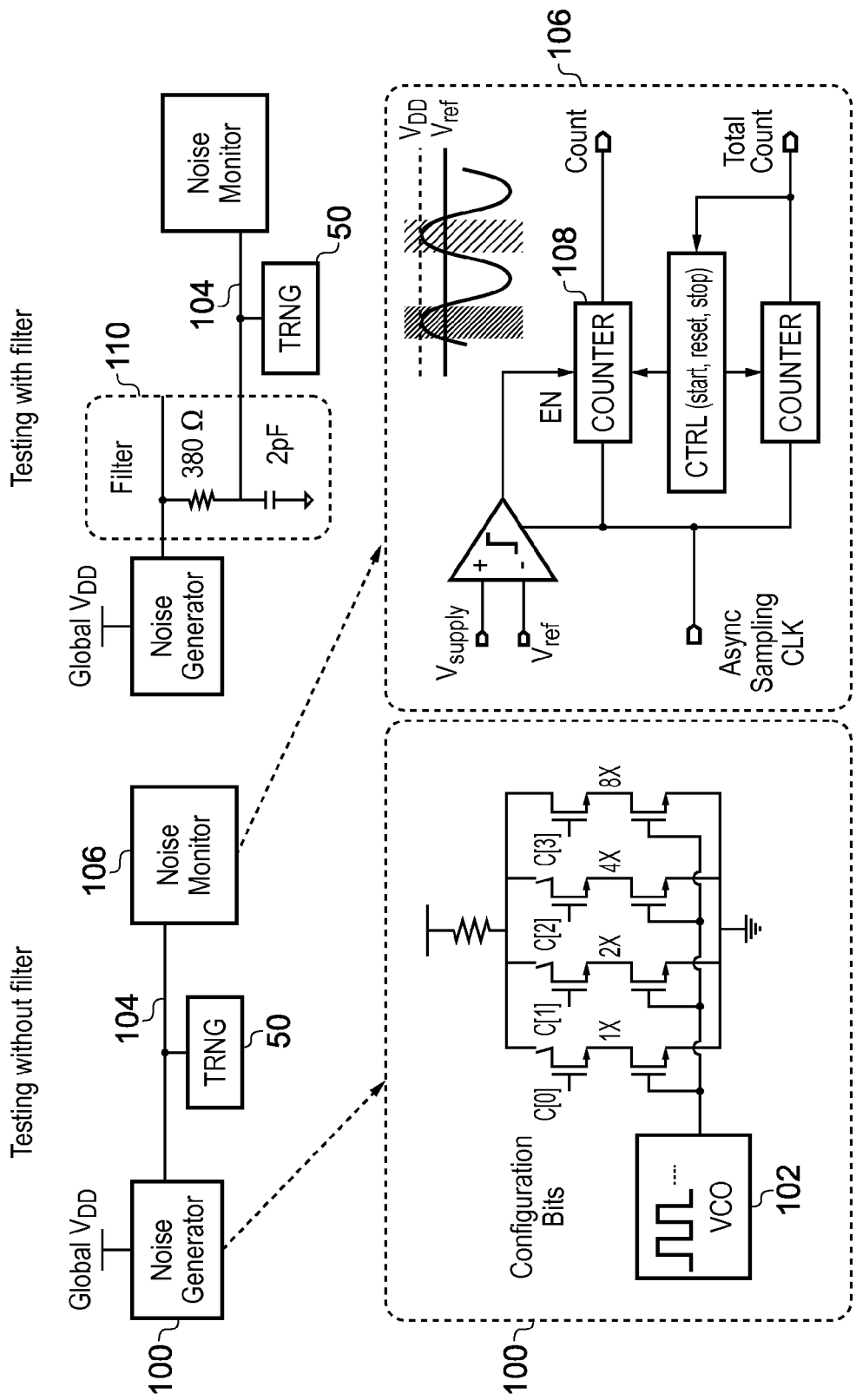
FIG. 9 illustrates a set up for testing the robustness of the TRNG against noise as well as an example of a TRNG provided with a filter on the power supply line for the TRNG.

All hardware TRNGs must cope with interference from a potentially noisy environment as well as dedicated attacks. Ring oscillators are known to be sensitive to frequency injection, which has been reported to introduce errors in ring oscillator-based TRNGs. To measure the S-edge TRNG's sensitivity to deliberate attack we tested its robustness with off-chip noise sources. Furthermore, we created on-chip test structures to both inject and measure noise and demonstrate means to protect from such noise (see FIG. 9). To measure sensitivity to frequency injection, a programmable noise generator 100 controlled by an on-chip voltage controlled oscillator 102 introduces substantial noise on the TRNGs power supply rail 104 (or at least the power supply rail for the ring oscillator 20), locking the oscillation and impacting the collapse event time. To measure noise amplitude on-chip, a noise monitor 106 is provided in which an asynchronous clock samples the noisy supply voltage, compares it with an external reference voltage, and increments a counter 108 accordingly. With sufficient samples ($2^{14}$ in our measurements) the noise amplitude can be determined from the counter value.

In addition, an RC noise filter 110 with 210 MHz corner (cutoff) frequency was designed to mitigate the impact of supply noise. As shown in the right hand portion of FIG. 9, the RC filter 110 may be provided on the power supply rail 104 of the TRNG 50 or the ring oscillator 20, and functions as a low pass filter so that relatively high frequency noise is eliminated. As discussed below, it has been found that this can be sufficient to protect against supply noise attacks. In some embodiments, the filter may not be required as RC elements within the integrated circuit itself may provide sufficient noise filtering. However to increase confidence that the TRNG is robust against attack, the filter can be provided.

The proposed 3-edge TRNG was evaluated using two test chips; one in 28 nm CMOS with 8 different rings; the other in 65 nm CMOS with 48 different TRNGs. The NIST Pub 800-22 RNG testing suite was used to evaluate the randomness of generated bits. As shown in FIG. 10, both 28 nm and 65 nm TRNGs passed all 15 NIST tests.

Using an RF signal generator, up to 600 mVpp noise was injected on the power supplies (after removing board decoupling caps) to test the TRNG's robustness against off-chip attack. The 65 nm TRNGs retained randomness up to 360 mVpp noise without the filter and up to the 600 mVpp generator limit with the filter. To compensate for filter IR drop, TRNGs with filters operate at 5% increased supply voltage, incurring a slight power penalty. Since ROs in 28 nm TRNGs operate at a higher frequency they are less sensitive to external attack; even unfiltered versions did not suffer randomness degradation at the generator limit EMI noise injected by antenna also did not cause failure in any randomness tests.

Figure 11:
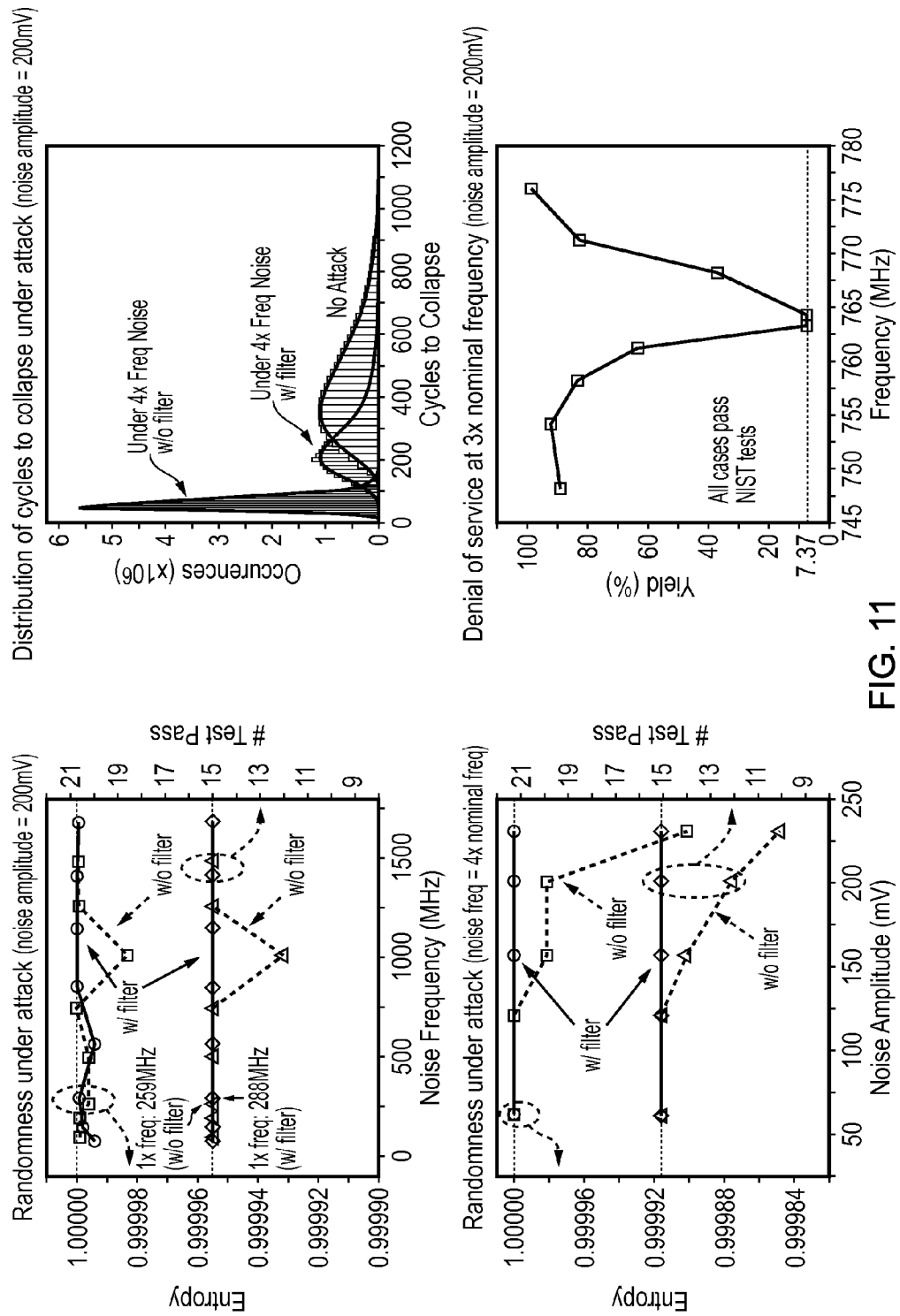
FIG. 11 shows experimental results indicating the randomness of the TRNG and the robustness of the TRNG to attack.

FIG. 11 shows the impact of supply noise on TRNG performance using on-chip noise generation. Even though a deliberate attacker will not have access to such a noise source, this test can demonstrate how readily a 3-edge TRNG can be integrated with other noisy circuits in a system-on-chip. TRNGs showed sensitivity to supply noise at frequencies near 1× and 4× nominal RO frequencies, reducing collapse time mean and variance. Randomness degrades at >125 mV noise amplitude and 4× frequency without a filter, but is recovered using a filter. By increasing filter R and/or C, protection against attack can be improved at the cost of additional power and/or area. Denial of service occurs when a TRNG cannot generate output bits due to external influence. This is observed only in unprotected TRNGs with on-chip noise generation at exactly 3× nominal frequency (see the bottom right plot of FIG. 11) since the ring locks to its 3× frequency mode, preventing collapse. In this case, yield (% of master cycles that generate outputs bits) drops to 7.37%. This can be prevented using the filter 110. Nevertheless, even at the 3× frequency noise generation, generated bits remain random (passing all tests), showing the robustness of the proposed TRNG.

The table of FIG. 12 summarizes measurement results of both 28 nm and 65 nm designs with comparisons to earlier TRNGs. The present technique is compared against the following systems:

[1] M. Bucci, et al., "A High Speed Oscillator Based True Random Number Generator for Cryptographic Applications on a Smart Card IC," IEEE Trans. Computers, April 2003.
[3] R. Brederlow, et al., "A Low-Power True Random Number Generator using Random Telegraph Noise of Single Oxide Traps," ISSCC, 2006.
[4] C. Tokunaga, et al., "True Random Number Generator with a Metastability-Based Quality Control," ISSCC, 2007.
[5] S. Mathew, et al., "2.4 Gbps, 7 mW All-Digital PVT-variation Tolerant True Random Number Generator for 45 nm CMOS High-Performance Microprocessors", IEEE JSSC, November 2012.
[6] M. Matsumoto, et al., "1200 µm2 Physical Random-Number Generators Based on SiN MOSFET for Secure Smart-Card Application," ISSCC, 2008.
[7] N. Liu, et al., "A true random number generator using time-dependent dielectric breakdown," Symp VLSI Circuits, 2011.

As shown in FIG. 12, the present technique provides a higher bit rate (throughput) than most of the other techniques, was able to pass all the NIST randomness tests, and provides increased energy efficiency (nJ/bit) and resistance of attack in comparison with the other techniques. Also, the present technique provides a TRNG which is easier to design because the fully digital circuit arrangement shown in FIG. 7 enables standard digital synthesis techniques to be used with conventional placing and routing algorithms, for example using a standard cell library to provide all the components of the TRNG 50.

Figure 13:
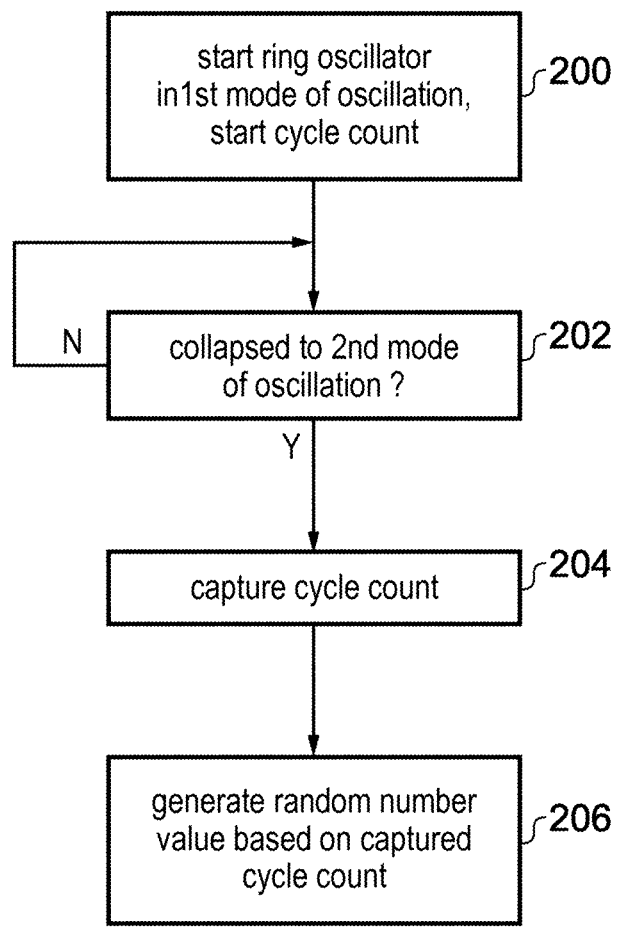
FIG. 13 illustrates a method of generating a true random number.

FIG. 13 schematically illustrates a method of generating true random numbers. At step 200, the ring oscillator 20 starts to oscillate in a first mode of oscillation in which multiple edges propagate around the ring simultaneously. The cycle counter 86 starts counting cycles of the ring oscillator 20. At step 202, the collapse detector 80 determines whether the ring oscillator 20 has collapsed to a second mode of oscillation in which fewer edges propagate around the ring. If not then the collapse detector keeps checking for a collapse. When the ring oscillator collapses to the second mode of oscillation, the method proceeds to step 204 at which the cycle count value from the cycle counter 86 is captured in the capture registers 90. The captured cycle count value represents the time between the start of oscillation in the first mode and the collapse to the second mode. This time is dependent on entropy in the form of thermal noise and so is highly random. At step 206 a random number is generated based on the captured cycle count by the random number determining unit 70 or an external device.

Figure 14:
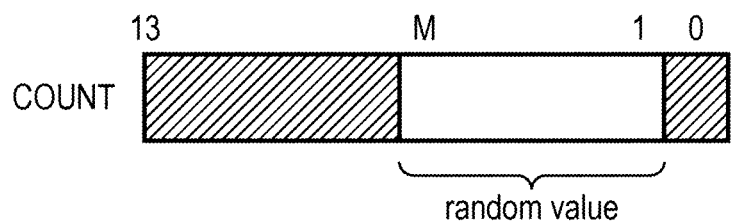
FIG. 14 schematically illustrates an example of mapping the collapse time value measured by the time measuring circuit to a random numeric value.

FIG. 14 shows an example of generating a random value from the captured cycle count. As shown in the top right graph of FIG. 11, the captured count values will exhibit a normal distribution, and so if this is mapped directly to a random number value then the probability distribution of the generated random numbers would not be uniform. To provide a more uniform distribution, a subset of the bits of the captured count value can be taken and other bits discarded. Typically the least significant bits of the count value will display the most uniform variation and so the upper bits of the count value can be truncated. FIG. 14 shows an example where the bits higher than bit [M] of the count value are truncated. Also, the least significant bit 0 of the count value may be sensitive to mismatching in the counter sampling flip flop 90. Therefore, by dropping this bit the remaining subset of bits [M:1] provide a random number with a more uniform distribution. If a random number having a greater number of bits than this subset is required, then multiple TRNGs 50 can be provided in parallel, with each TRNG generating a portion of the random value, and the portions can then be concatenated to form the overall random value. Alternatively, the same TRNG 50 could generate several random bit strings in successive cycles and then the values generated in different cycles may be concatenated to generate a larger random value.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An apparatus for generating a value for deriving a random number comprising:
   a ring oscillator;
   a control circuit configured to trigger the ring oscillator to start oscillating in a first mode of oscillation at an oscillation start time; and
   a time measuring circuit configured to measure a collapse time value indicative of a length of time from the oscillation start time to an oscillation collapse time at which the ring oscillator switches from the first mode of oscillation to a second mode of oscillation.

2. The apparatus according to claim 1, wherein in the first mode of oscillation, the ring oscillator is configured to oscillate at a higher frequency than in the second mode of oscillation.

3. The apparatus according to claim 1, wherein in the first mode of oscillation, the ring oscillator is configured to propagate a plurality of edges around the ring oscillator with a phase difference between each edge; and
   in the second mode of oscillation, the ring oscillator is configured to propagate fewer edges around the ring oscillator than in the first mode of oscillation.

4. The apparatus according to claim 3, wherein in the second mode of oscillation, the ring oscillator is configured to propagate a single edge around the ring oscillator.

5. The apparatus according to claim 3, wherein in the first mode of oscillation, the ring oscillator is configured to propagate an odd number of edges around the ring oscillator.

6. The apparatus according to claim 3, wherein when starting oscillating in the first mode of oscillation, the ring oscillator is configured to propagate the plurality of edges with an equal phase difference between each successive pair of edges.

7. The apparatus according to claim 1, wherein the ring oscillator comprises a plurality of input nodes at different stages of the ring oscillator;
   the control circuit is configured to supply a start signal to the plurality of input nodes at the oscillation start time; and
   in response to the start signal, each input node is configured to inject a respective edge into the ring oscillator.

8. The apparatus according to claim 1, wherein the time measuring circuit comprises:
   a cycle counter configured to maintain a cycle count value indicating a number of cycles elapsed since the oscillation start time;

a collapse detector configured to output a collapse signal in response to detecting the ring oscillator switching from the first mode of oscillation to the second mode of oscillation; and a capture circuit configured to capture a current value of the cycle count value in response to the collapse signal.

9. The apparatus according to claim 8, wherein the cycle counter is configured to count oscillation cycles of an output of the ring oscillator.

10. The apparatus according to claim 8, wherein the time measuring circuit comprises a reference ring oscillator configured to oscillate at a predetermined frequency; and the collapse detector comprises a phase frequency detector configured to generate the collapse signal based on a phase comparison of an output of the ring oscillator and an output of the reference ring oscillator.

11. The apparatus according to claim 10, wherein the ring oscillator is configured to oscillate at a first frequency in the first mode of oscillation and configured to oscillate at a second frequency in the second mode of oscillation, the second frequency being less than the first frequency; and the predetermined frequency of the reference ring oscillator is between the first frequency and the second frequency.

12. The apparatus according to claim 8, wherein the time measuring circuit comprises a glitch removal circuit configured to filter out glitches in the collapse signal generated by the collapse detector.

13. The apparatus according to claim 8, wherein the time measuring circuit comprises a shift register having a plurality of shift stages;

the shift register is configured to receive the collapse signal generated by the collapse detector at a first stage of the shift register; and the capture device is configured to capture the current value of the cycle count value in response to an output of a final stage of the shift register.

14. The apparatus according to claim 1, comprising a random number determining unit configured to determine a random number value based on the collapse time value measured by the measuring circuit.

15. The apparatus according to claim 14, wherein the random number determining unit is configured to determine the random number value based on a subset of bits of the collapse time value measured by the time measuring circuit.

16. The apparatus according to claim 14, wherein the random number determining unit is configured to truncate the collapse time value to generate a truncated value corresponding to a plurality of least significant bits of the collapse time value, and to determine the random number value based on the truncated value.

17. The apparatus according to claim 16, wherein the random number determining unit is configured to determine the random number value based on the truncated value excluding the least significant bit of the truncated value.

18. The apparatus according to claim 1, comprising a low pass filter coupled between the ring oscillator and a power supply rail for the ring oscillator.

19. An apparatus for generating a value for deriving a random number comprising:

ring oscillator means for oscillating in one of a first mode of oscillation and a second mode of oscillation;

control means for triggering the ring oscillator to start oscillating in the first mode of oscillation at an oscillation start time; and time measuring means for measuring a collapse time value indicative of a length of time from the oscillation start time to an oscillation collapse time at which the ring oscillator means switches from the first mode of oscillation to the second mode of oscillation.

20. A method of generating a true random number, comprising:

at an oscillation start time, triggering a ring oscillator to start oscillating in a first mode of oscillation;

measuring a collapse time value indicative of a length of time from the oscillation start time to an oscillation collapse time at which the ring oscillator switches from the first mode of oscillation to a second mode of oscillation; and determining the true random number based on the collapse time value.

* * * * *